United States Patent
Kang et al.

(10) Patent No.: US 10,922,472 B2
(45) Date of Patent: Feb. 16, 2021

(54) METHOD OF MANUFACTURING SEMICONDUCTOR DEVICE

(71) Applicant: Samsung Electronics Co., Ltd., Suwon-si (KR)

(72) Inventors: Myoung-ho Kang, Suwon-si (KR); Jae-myoung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 24 days.

(21) Appl. No.: 16/458,225

(22) Filed: Jul. 1, 2019

(65) Prior Publication Data

US 2020/0192996 A1 Jun. 18, 2020

(30) Foreign Application Priority Data

Dec. 13, 2018 (KR) ........................ 10-2018-0161175

(51) Int. Cl.
G06F 30/398 (2020.01)
G03F 1/36 (2012.01)
H01L 21/8238 (2006.01)

(52) U.S. Cl.
CPC .............. *G06F 30/398* (2020.01); *G03F 1/36* (2013.01); *H01L 21/823821* (2013.01)

(58) Field of Classification Search
CPC ....... G03F 1/36; G03F 30/398; H01L 27/0203
USPC .................................................... 716/53–55
See application file for complete search history.

(56) References Cited

U.S. PATENT DOCUMENTS

| | | | |
|---|---|---|---|
| 6,214,496 B1 | 4/2001 | Carpio et al. | |
| 7,529,421 B2 | 5/2009 | Beauchaine et al. | |
| 7,735,053 B2 | 6/2010 | Harazaki | |
| 8,015,511 B2 | 9/2011 | Krasnoperova et al. | |
| 8,429,571 B2 | 4/2013 | Kim | |
| 8,703,595 B2 | 4/2014 | Chuang et al. | |
| 2008/0052660 A1* | 2/2008 | Shim | G03F 1/36 716/53 |
| 2011/0167394 A1* | 7/2011 | Lippincott | G03F 1/36 716/53 |

(Continued)

FOREIGN PATENT DOCUMENTS

| | | |
|---|---|---|
| JP | 2008-033277 A | 2/2008 |
| KR | 10-2000-0063045 A | 10/2000 |
| KR | 10-1677344 B1 | 11/2016 |

*Primary Examiner* — Paul Dinh
(74) *Attorney, Agent, or Firm* — Muir Patent Law, PLLC

(57) ABSTRACT

A method of manufacturing a semiconductor device is provided as follows. A mask layout for forming a target pattern of a multi-height cell including a rectangular notch is generated. A preliminary rectangular mask pattern corresponding to the rectangular notch is detected from the mask layout. The multi-height cell is formed of standard cells arranged and connected to each other in a direction and the rectangular notch is disposed between two adjacent standard cells. A hexagonal mask pattern is, in response to the detecting of the preliminary rectangular mask pattern, placed on at least one short side of the preliminary rectangular mask pattern to generate a combined mask pattern. An outer boundary of the combined mask pattern remains in the mask layout and corresponds to the rectangular notch of the target pattern. A target mask and the semiconductor device are formed based on the combined mask pattern.

10 Claims, 11 Drawing Sheets

(56) References Cited

U.S. PATENT DOCUMENTS

2012/0174046 A1\* 7/2012 Credendino .............. G03F 1/36
  716/53
2018/0203342 A1 7/2018 Du et al.

\* cited by examiner

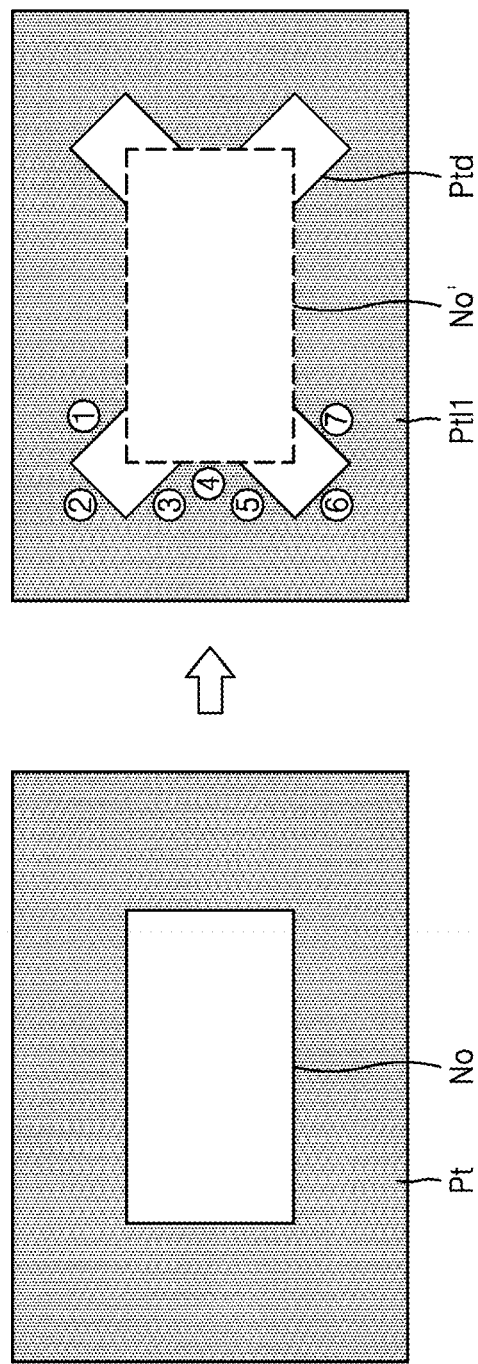

METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2018-0161175, filed on Dec. 13, 2018 in the Korean Intellectual Property Office, the disclosure of which is incorporated by reference herein in its entirety.

BACKGROUND

The inventive concept relates to a method of designing a pre-optical proximity correction (OPC) mask layout, an OPC method, and a method of manufacturing a mask by using the OPC method.

In semiconductor processes, a photolithography process using a mask may be performed to form a pattern on a semiconductor substrate such as a wafer. The mask may be referred to as a pattern transcript in which a pattern of an opaque material is formed on a transparent substrate. Mask manufacturing processes will be simply described as follows. First, after designing a requested circuit and layout for the circuit, final mask data obtained through OPC is transmitted as mask tape-out (MTO) design data. Then, the mask may be manufactured by performing mask data preparation (MDP) based on the MTO design data and performing a front end of line (FEOL) such as an exposure process and a back end of line (BEOL) such as a defect test.

SUMMARY

The inventive concept provides a mask layout-generating method in which a multi-height cell may be implemented by one mask by effectively controlling a corner rounding phenomenon of a rectangular notch in the multi-height cell, an optical proximity correction (OPC) method, and a method of manufacturing a mask using the OPC method.

According to an exemplary embodiment of the present inventive concept, a method of manufacturing a semiconductor device is provided as follows. A mask layout for forming a target pattern of a multi-height cell including a rectangular notch is generated. A preliminary rectangular mask pattern corresponding to the rectangular notch of the multi-height cell is detected from the mask layout. The multi-height cell is formed of standard cells arranged and connected to each other in a first direction and the rectangular notch is disposed between two adjacent standard cells. A hexagonal mask pattern is, in response to the detecting of the preliminary rectangular mask pattern, placed on at least one short side of the preliminary rectangular mask pattern to generate a combined mask pattern of the preliminary rectangular mask pattern and the hexagonal mask pattern. An outer boundary of the combined mask pattern remains in the mask layout and corresponds to the rectangular notch of the target pattern. A target mask and the semiconductor device are formed based on the combined mask pattern.

According to an exemplary embodiment of the present inventive concept, a method of manufacturing a semiconductor device is provided as follows. A pre-OPC mask layout is generated. The per-OPC mask layout includes a notch design of which a boundary corresponds to an outer boundary of a combined mask pattern of a preliminary rectangular mask pattern and a hexagonal mask pattern that is placed on at least one side of the preliminary rectangular mask pattern. An edge of the hexagonal mask pattern of the combined mask pattern is divided into fragments. The edge of the hexagonal mask pattern of the combined mask pattern is placed outside the preliminary rectangular mask pattern. Mask data of the pre-OPC mask layout with the plurality of fragments are inputted to an optical proximity correction (OPC) model. A contour of a first target pattern transcribed from the combined mask pattern is estimated through simulation. An edge placement error (EPE) is calculated that is a difference between the contour and an edge of an intended target pattern. A displacement of each of the plurality of fragments is determined based on the EPE. A corrected mask layout is generated by moving each of the plurality of fragments by the displacement. A target mask and the semiconductor device are formed based on the corrected mask layout.

According to an exemplary embodiment of the present inventive concept, a method of manufacturing a semiconductor device is provided as follows. A pre-OPC mask layout is generated to form an intended target pattern including a rectangular notch of a multi-height cell on a substrate. The pre-OPC mask layout includes a hexagonal notch design in which a hexagonal mask pattern is placed on at least one side of a preliminary rectangular mask pattern corresponding to the rectangular notch. An edge of the hexagonal mask pattern of the hexagonal notch design is divided into fragments. Mask data including the plurality of fragments are inputted to an optical proximity correction (OPC) model. A contour of a first target pattern is estimated using the pre-OPC mask layout with the plurality of fragments through simulation. An edge placement error (EPE) is calculated that is a difference between the contour of the first target pattern and an edge of the intended target pattern. Whether to re-perform the estimating of the contour of the first target pattern is determined. Final mask data are determined when it is determined not to re-perform the estimating of the contour of the first target pattern. The final mask data is generated as mask tape-out (MTO) design data. Mask-forming data are generated based on the MTO design data. Exposure is performed on a mask blank based on the mask-forming data to generate a target mask. The semiconductor device is formed using the target mask.

According to an exemplary embodiment of the present inventive concept, an OPC method is provided as follows. when a rectangular notch is included in a target pattern, a mask layout including a hexagonal notch design to correspond to the notch is generated. An edge of the hexagonal notch design is divided into fragments. The mask layout generated according to the present inventive concept, the corner rounding phenomenon without violating a mask rule check (MRC) may be implemented. In addition, in the OPC method according to the inventive concept, based on the mask layout obtained through the above-described process, the target pattern of the multi-height cell structure is formed on the wafer and accordingly, using one mask, the target pattern having the multi-height cell structure including the notch is manufactured.

BRIEF DESCRIPTION OF THE DRAWINGS

Embodiments of the inventive concept will be more clearly understood from the following detailed description taken in conjunction with the accompanying drawings in which:

FIGS. 2A and 2B are conceptual views illustrating a method of suppressing a corner rounding phenomenon;

DETAILED DESCRIPTION OF THE EMBODIMENTS

Figure 1:
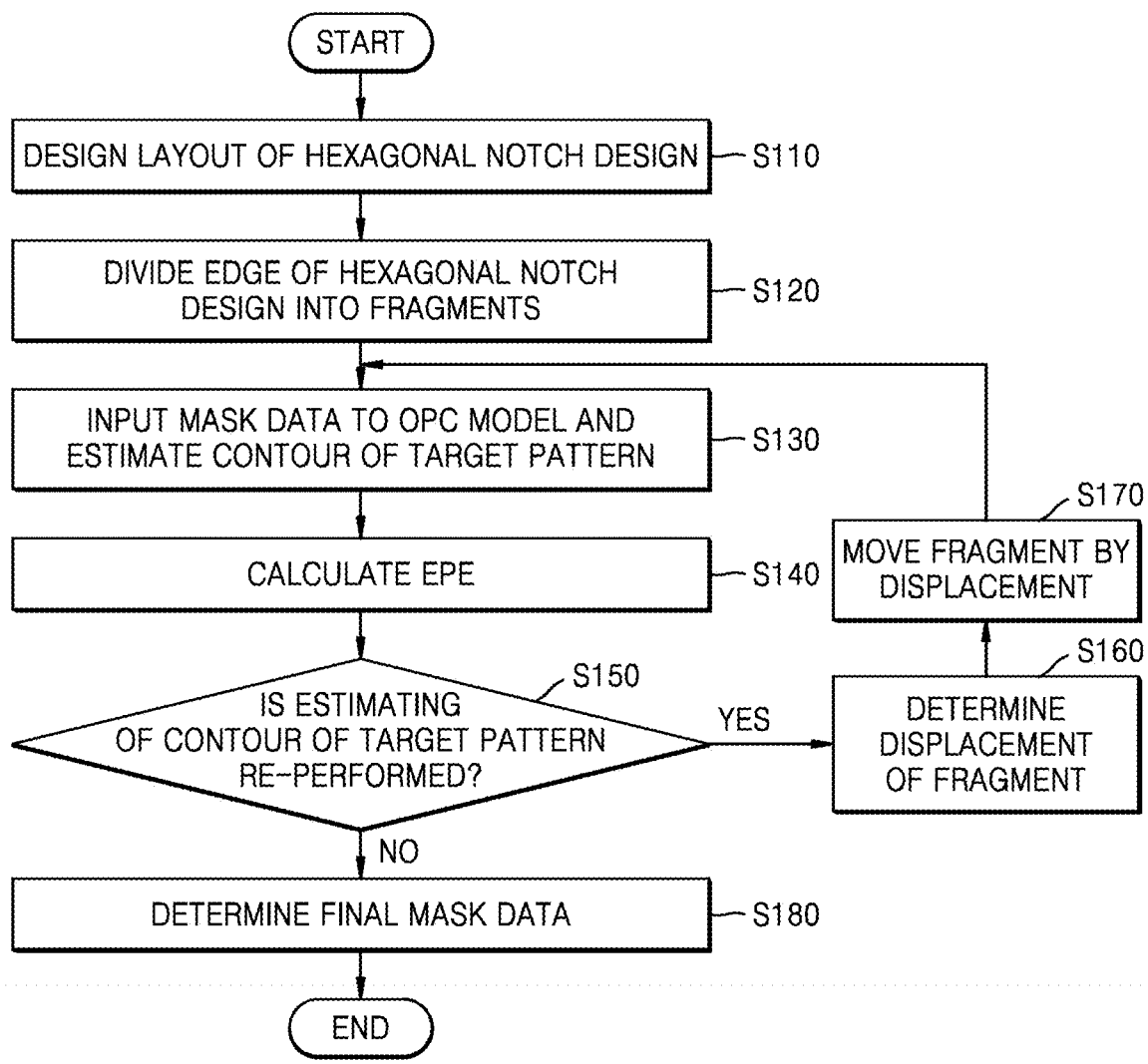
FIG. 1 is a flowchart schematically illustrating processes of an optical proximity correction (OPC) method according to an embodiment of the inventive concept.

Embodiments of the inventive concept will be more clearly understood from the following detailed description taken in conjunction with the accompanying drawings. The same component is denoted by the same reference numeral and repeated description thereof will be omitted.

FIG. 1 is a flowchart schematically illustrating processes of an optical proximity correction (OPC) method according to an embodiment of the inventive concept.

Figure 7:
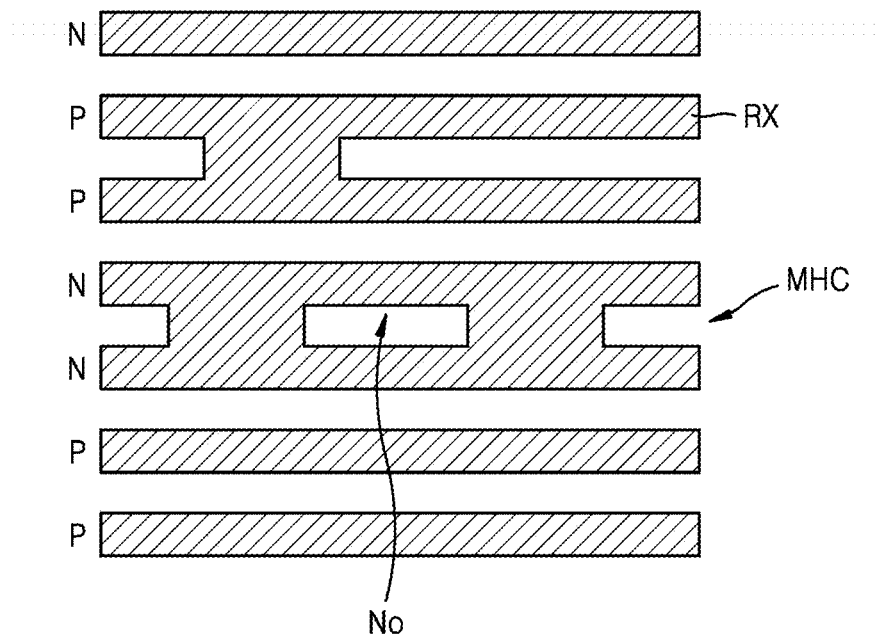
FIG. 7 is a plan view illustrating a multi-height cell structure.

Referring to FIG. 1, in the OPC method according to the current embodiment, first, a pre-OPC mask layout of a hexagonal notch design is designed in operation S110. Here, in the hexagonal notch design included in a pattern on a mask, in order to form a target pattern including a rectangular notch, at least one side of a rectangular pattern (i.e., a preliminary rectangular mask pattern) on the mask corresponding to the notch of the target pattern is changed into a hexagonal pattern. On the other hand, the target pattern is to be formed on a substrate such as a wafer through an exposure process using the mask. In addition, the pre-OPC mask layout may be converted to a final mask data using the OPC method, and the final mask data may be formed on the mask such as a blank mask. That is, the layout of the hexagonal notch design may include the hexagonal notch design for the pattern on the mask. A shape of the hexagonal notch design will be described in detail with reference to FIG. 3. The generating of the pre-OPC mask layout is described in detail. The pre-POC mask layout may include mask data for forming a target pattern of a multi-height cell including a rectangular notch. In the generating of the pre-OPC mask layout, a preliminary rectangular mask pattern corresponding to the rectangular notch of the multi-height cell may be detected from a mask layout. The preliminary rectangular mask pattern may correspond to a rectangular pattern No' of FIG. 2B which will be described later. The multi-height cell may be described later with reference to FIGS. 7 and 8. The multi-height cell may be formed of a plurality of standard cells arranged and connected to each other in a first direction. The rectangular notch may be disposed between two adjacent standard cells of the plurality of standard cells. If the preliminary rectangular mask pattern is detected, a hexagonal mask pattern may be placed on at least one short side of the preliminary rectangular mask pattern to generate a combined mask pattern of the preliminary rectangular mask pattern and the hexagonal mask pattern. An outer boundary of the combined mask pattern may remain in the pre-OPC mask layout and correspond to the rectangular notch of the target pattern. The detecting of the preliminary rectangular mask pattern may include 1) determining whether two chop mask patterns, if placed on a first side of the at least one short side, affect each other or affect a first short side between the two chop mask patterns in a process of performing an optical proximity correction (OPC) model on the two chop mask patterns, the two chop mask patterns being formed in diagonal direction at two vertices of the first short side of the at least one short side, respectively, and 2) if the two chop mask patterns are determined as affecting each other or affecting the first short side between the two chop mask patterns, the placing of the hexagonal mask pattern is performed on the at least one short side of the preliminary rectangular mask pattern instead of placing the two chop patterns thereon. Each of the two chop mask patterns may correspond to a chop pattern Pch of FIG. 2A which will be described later. In an exemplary embodiment, the detecting of the preliminary rectangular mask pattern includes determining whether the first side of the preliminary rectangular mask pattern has a length equal to a predetermined value. In an example embodiment, the predetermined value may correspond to a height of one of the plurality of standard cells. In FIG. 7, two standard cells of n-type cell regions have the rectangular notch No of FIG. 2B. With reference to FIG. 3 which will be described in more detail, the hexagonal mask pattern HP of the combined mask pattern may include a first side ① and a second side ② that surround a first vertex at which a short side of the preliminary rectangular mask pattern meets a first long side thereof, a fourth side ④ and a fifth side ⑤ that surround a second vertex at which the short side meets a second long side, and a third side ③ that connects the second side ② to the fourth side ④. The first to fifth sides may be positioned outside the preliminary rectangular mask pattern and a sixth side that faces the third side does not exist in the combined mask pattern.

As described above, the pattern on the mask is transcribed to a substrate through an exposure process and accordingly, the target pattern may be formed on the substrate. However, due to a characteristic of the exposure process, a shape of the target pattern may be commonly different from a shape of the mask pattern. On the other hand, a rectangular notch may exist in a multi-height cell structure when the target pattern includes the multi-height cell structure. The multi-height cell structure and the rectangular notch will be described in detail with reference to FIG. 7.

Next, an edge of the hexagonal notch design is divided into a plurality of fragments in operation S120. A fragment may mean a linear segment corresponding to the edge of the hexagonal notch design or data on the segment. The edge of the hexagonal notch design may be divided into a plurality of fragments by a predetermined division rule. A length of the fragment and the division rule may be set by a user who performs the OPC method. In the OPC method according to the current embodiment, operation S120, in which the edge of the hexagonal notch design is divided into the fragments, will be described in detail with reference to FIG. 3.

For reference, as the target pattern to be formed on a wafer is finer, an optical proximity effect (OPE) such as distortion of the target pattern may occur due to an influence between adjacent patterns in the exposure process. To solve this problem, in the OPC method, the layout of the mask pattern is corrected or pre-distorted to avoid the occurrence of the OPE. The OPC method is divided into a rule-based OPC method and a simulation-based or model-based OPC method. The OPC method according to the current embodiment may be, for example, the model-based OPC method. In the model-based OPC method, since only measurement results of representative patterns are used without measuring all test patterns, it may be advantageous in terms of time and cost.

Then, mask data of the pre-OPC mask layout with the plurality of fragments are input to an OPC model and contour of the target pattern is estimated through simulation in operation S130. The OPC model is a simulation model for estimating the contour of the target pattern. Various basic data may be input to the OPC model as input data. Here, the basic data may include the mask data on the fragments. In addition, the basic data may include information data on photoresist (PR) such as a thickness, refractivity, and a dielectric constant and may include data on a source map on a shape of an illumination system. The basic data is not limited to the above exemplary data items. On the other hand, the mask data may include data such as shapes of patterns, positions of patterns, kinds of measurements (measurements on spaces or lines) of the patterns, and a basic measurement value.

The contour of the target pattern as a result obtained through simulation using the OPC model may correspond to the shape of the target pattern to be formed on the wafer through the exposure process using the mask. Here, the pattern on the wafer may correspond to, for example, an after develop inspection (ADI) pattern. Therefore, an object of the OPC method is making the contour as similar as possible to the shape of the target pattern.

After estimating the contour of the target pattern, an edge placement error (EPE) is calculated for each fragment in operation S140. The EPE may be calculated by the following Equation (1).

$$EPE = \text{an intended target pattern} - \text{a contour of a target pattern obtained from simulation} \quad (1)$$

The EPE may mean a distance or a difference between the intended target pattern and an edge of the contour. Here, the intended target pattern is similar to the target pattern. However, considering a corner rounding phenomenon in the exposure process, in the intended target pattern, the smallest rounding shape may be applied to a corner. For example, the intended target pattern may include an allowable degree of the corner rounding phenomenon.

In general, when the EPE is large, a difference between the intended target pattern and the contour is large, which may mean that a layout of a corresponding mask is not proper for forming the target pattern. Therefore, to implement the layout of the mask that is proper for forming the target pattern, a process of controlling the EPE not to be greater than a set reference value by changing the layout of the mask may be necessary.

The EPE is calculated for each fragment. A control point for calculating the EPE by the fragment may be selected on the intended target pattern. One or a plurality of control points may be selected in accordance with the fragment. In addition, according to an embodiment, a plurality of fragments may share a control point. Control point selection and EPE calculation in accordance with the control point selection will be described in more detail with reference to FIGS. 5A to 5C.

After the EPE calculation, it is determined whether to re-perform operation S130 of estimating the contour of the target pattern in operation S150. For example, it may be determined whether to re-perform operation S130 of estimating the contour of the target pattern in accordance with whether the EPE is not greater than a set reference value. In detail, when the EPE is greater than the set reference value, it is determined to re-perform operation S130 of estimating the contour of the target pattern and, when the EPE is not greater than the set reference value, it may be determined not to re-perform operation S130 of estimating the contour of the target pattern.

On the other hand, according to an embodiment, whether to re-perform operation S130 of estimating the contour of the target pattern may be determined by comparing the number of repetitions of operation S130 of estimating the contour of the target pattern to a set reference number of times. In detail, when the number of repetitions of operation S130 of estimating the contour of the target pattern is less than the set reference number of times, it is determined to re-perform operation S130 of estimating the contour of the target pattern and, when the number of repetitions of operation S130 of estimating the contour of the target pattern corresponds to the reference number of times, it may be determined not to re-perform operation S130 of estimating the contour of the target pattern. For reference, the reference number of times may be set based on an average number of times or the largest number of times by which the EPE reaches the set reference value when operation S130 of estimating the contour of the target pattern for previous target patterns is repeatedly performed.

When operation S130 of estimating the contour of the target pattern is re-performed, a displacement DIS of the fragment may be determined in operation S160. The displacement DIS of the fragment may be calculated by the following Equation (2).

$$DIS = EPE * FB \quad (2)$$

wherein, FB as a feedback factor may be set by the user who performs the OPC method. FB may be commonly greater than −1 and less than +1. However, a value of FB is not limited thereto. Here, (−) and (+) may mean movement directions. As a result, the displacement DIS of the fragment means a distance by which a current fragment is moved and may be less than an absolute value of the EPE.

When the displacement DIS of the fragment is determined, the fragment is moved by the displacement DIS in operation S170. The movement of the fragment corresponds to movement of the edge of the hexagonal notch design and a change in layout including the hexagonal notch design on the mask.

Then, operation S130 is performed to estimate the contour of the target pattern and the contour of the target pattern is extracted again by inputting the mask data to the OPC model. Here, data of the fragment changed by the movement is input to the OPC model as mask data. For example, a corrected mask layout may be generated by the movement of the fragment, and when the corrected mask layout does not generate the intended target pattern, the corrected mask layout may be re-input to the OPC model.

When operation S130 of estimating the contour of the target pattern is not re-performed, final mask data is determined in operation S180. Here, the final mask data may include data of a fragment in a final position.

In general, the EPE obtained by estimating the contour of the target pattern by performing the OPC model for the first time may significantly deviate from the set reference value. Therefore, after repeating operation S130 of estimating the contour of the target pattern to operation S170 of moving the fragment by the displacement DIS several times to dozens of times, it may be determined not to re-perform operation S130 of estimating the contour of the target pattern. As a result, the mask data including the data of the fragment moved by repeating operation S170 of moving the fragment by the displacement DIS a plurality of number of times may be determined as the final mask data.

In the OPC method according to the current embodiment, based on the design of the layout including the hexagonal notch design, the layout of the mask is corrected so that the contour coincides with the target pattern by repeatedly performing operation S130 of estimating the contour of the target pattern by the OPC model to operation S170 of moving the fragment by the displacement DIS and making the EPE not greater than the set reference value. In more detail, the OPC method according to the current embodiment includes a process of designing a layout including the hexagonal notch design obtained by changing at least one side of the rectangular pattern on the mask into the hexagonal pattern to correspond to the notch when the rectangular notch is included in the target pattern and a process of dividing the edge of the hexagonal notch design into fragments. In addition, the EPE is made not to be greater than the set reference value without violating a mask rule check (MRC) by repeatedly performing operation S130 of estimating the contour of the target pattern by the OPC model to operation S170 of moving the fragment by the displacement DIS and accordingly, the mask layout capable of minimizing the corner rounding phenomenon may be implemented. In addition, in the OPC method according to the current embodiment, based on the mask layout obtained through the above-described process, a mask capable of optimally forming the target pattern on the wafer may be manufactured.

For reference, the MRC may mean check for limitations on a width or a distance by which a pattern is to be maintained when the mask is manufactured. For example, when the mask is manufactured, the width of the pattern may not be less than the set smallest width or the distance between patterns may not be less than the set smallest distance. The MRC may mean a process of checking whether the layout of the mask violates the limitations. On the other hand, due to resolution limit, a corner rounding phenomenon in which rounding occurs in the corner of the pattern may operate as a main cause of reduction in process margin in the exposure process. For example, since the MRC and the corner rounding phenomenon are a trade-off, there are limitations on minimizing the corner rounding phenomenon without violating the MRC. That is, when the OPC method is performed to minimize the corner rounding phenomenon and to approach the target pattern, the MRC may be violated. To the contrary, when the OPC method is performed without violating the MRC, the corner rounding phenomenon increases to significantly deviate from the target pattern and accordingly, defects may occur in the OPC method.

In the OPC method according to the current embodiment, the layout including the hexagonal notch design to correspond to the notch of the target pattern is designed and the edge of the hexagonal notch design is divided into fragments. Therefore, in the OPC method according to the current embodiment, the corner rounding phenomenon may be effectively controlled without violating the MRC.

Figure 2A:
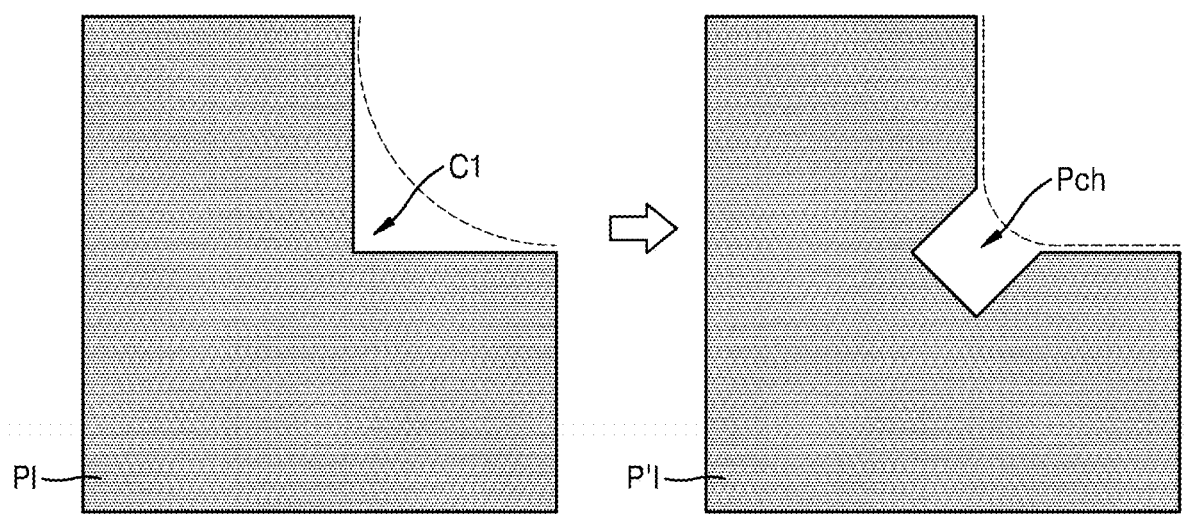
Figure 3:
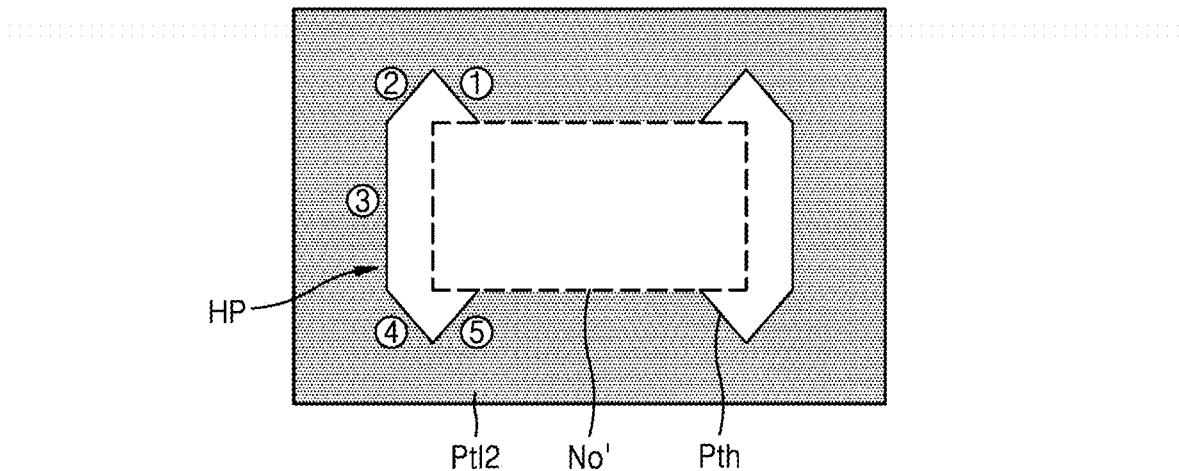
FIG. 3 is a conceptual view for a layout including a hexagonal notch design in an OPC method according to an embodiment of the inventive concept.

FIGS. 2A and 2B are conceptual views illustrating a method of suppressing a corner rounding phenomenon.

Referring to FIG. 2A, as illustrated on the left, a mask layout P1 of an L-shaped pattern includes a concave corner C1. In the corner C1, the corner rounding (a dashed line) phenomenon may occur. In order to suppress the corner rounding phenomenon, as illustrated on the right, a method of reducing the corner rounding (the dashed line) phenomenon by forming a mask layout P'1 of the L-shaped pattern such that a pattern in a diagonal direction, for example, a chop pattern Pch, is inserted may be considered. Similarly, in a convex corner in the opposite to the concave corner C1, a method of reducing the corner rounding phenomenon by forming a layout such that the chop pattern protrudes may be considered. However, it may be difficult to form the chop pattern in the corner in accordance with the shape of the entire pattern. Alternatively, although the chop pattern is formed in the corner, it may not contribute to reduction in the corner rounding phenomenon.

Referring to FIG. 2B, as illustrated on the left, a method of forming the chop pattern in each of internal corners of the target pattern Pt including the rectangular notch No therein may have the following problem. For example, as illustrated on the right, in a mask layout Ptl 1 including a diagonal notch design Ptd in which the chop patterns are respectively formed in both vertices of one side of a rectangular pattern No' corresponding to the notch No, edges corresponding to ① to ⑦ are formed and control points for the EPEs are selected in ① to ⑦ and accordingly, divergence may occur without satisfying the EPEs. In addition, when a shape to which the OPC is applied (hereinafter, referred to as 'an OPC shape') is complicated, a mask enhancement error occurs when the mask is formed and accordingly, the complexity of a process increases and a process variation band (PVB) may increase.

On the other hand, although not shown, in a kissing pattern including concave corners on both sides, since the MRC is violated when the chop patterns are formed in the corners, a method of forming the chop patterns in the corners may not be applied.

FIG. 3 is a conceptual view for a layout including a hexagonal notch design in an OPC method according to an embodiment of the inventive concept.

Referring to FIG. 3, for the target pattern Pt including the rectangular notch No on the left of FIG. 2B, a mask layout Ptl2 including the hexagonal notch design Pth illustrated in FIG. 3 may be designed. The hexagonal notch design Pth may include two hexagonal patterns HP corresponding to two short sides of the rectangular pattern No' corresponding to the notch No and two long sides of the rectangular pattern No'. The hexagonal pattern HP may include a first side ① and a second side ② that surround one vertex of the short side of the rectangular pattern No', a fourth side ④ and a fifth side ⑤ that surround the other vertex of the short side, and a third side ③ that connects the second side ② and the fourth side ④. The first to fifth sides ① to ⑤ are all positioned outside the short side of the rectangular pattern No' and a sixth side that faces the third side ③ does not exist. In addition, as illustrated in FIG. 3, both ends of the long side of the rectangular pattern No' may be excluded from the hexagonal notch design Pth.

In the OPC method according to the current embodiment, in relation to the target pattern Pt including the rectangular notch No, the mask layout Ptl2 including the hexagonal notch design Pth having the above shape is designed, and accordingly, a degree of freedom of edge fragments may be optimized in diagonal directions of internal vertices. Therefore, a simple OPC shape for the notch layout without distortion may be found by properly controlling the corner rounding phenomenon of the notch No. In addition, by securing the simple OPC shape, it is possible to reduce the mask enhancement error and the process complexity and accordingly, it is possible to minimize the corner rounding phenomenon and to improve the PVB. As a result, in the OPC method according to the current embodiment, the mask layout Ptl2 including the hexagonal notch design Pth is designed and accordingly, it is possible to generate the layout of the mask capable of minimizing the corner rounding phenomenon and implementing a pattern close to the target pattern.

Figure 4:
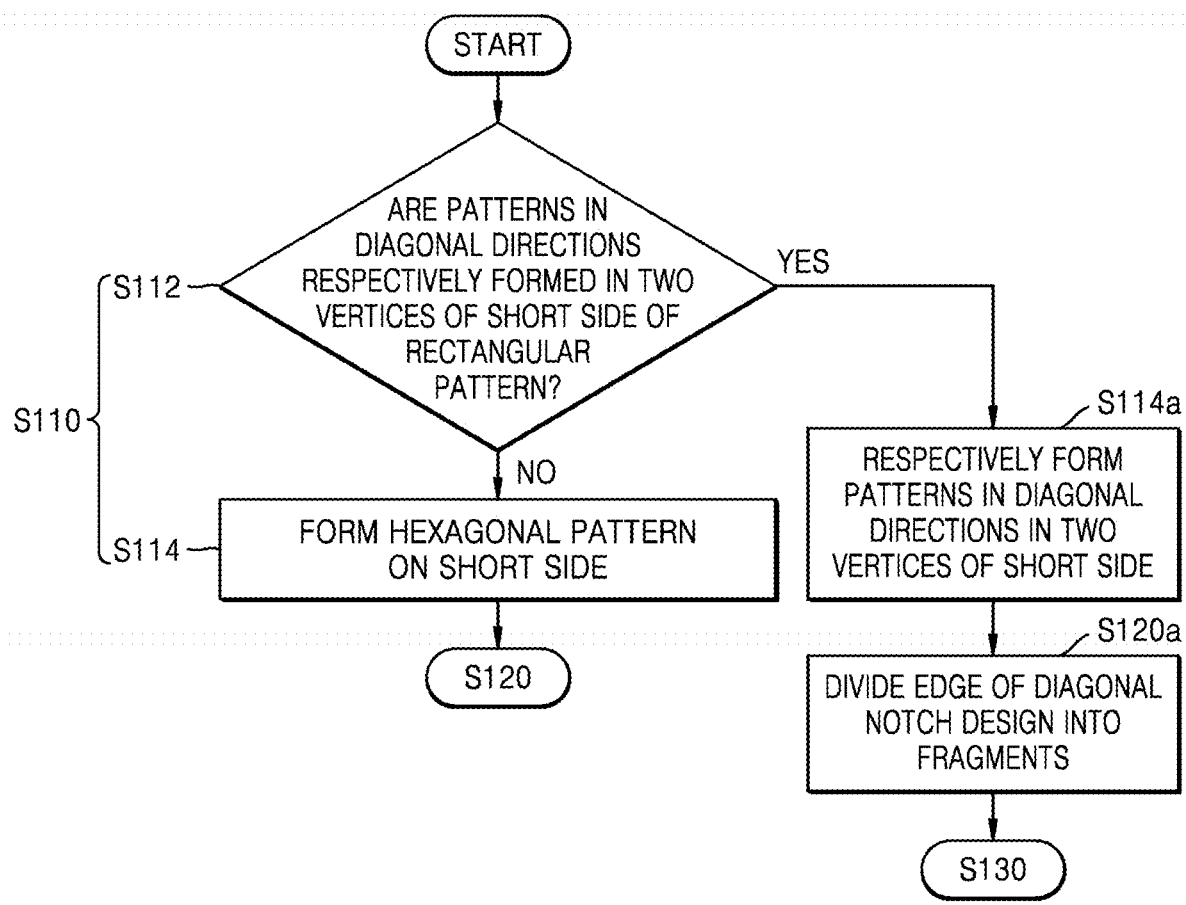
FIG. 4 is a flowchart illustrating a process of designing a layout of a hexagonal notch design in detail in the OPC method of FIG. 1.

FIG. 4 is a flowchart illustrating a process of designing a pre-OPC mask layout of a hexagonal notch design in detail in the OPC method of FIG. 1, as described with reference to FIGS. 2B and 3. Descriptions previously provided with reference to FIGS. 1 to 3 are briefly given or omitted.

Referring to FIG. 4, first, it is determined whether to form the patterns in the diagonal directions, for example, the chop patterns in the two vertices of the short side of the rectangular pattern No' (i.e., the preliminary rectangular mask pattern) in operation S112. Whether to form the chop patterns may be determined in accordance with whether changes in the chop patterns affect each other or affect the short side. That is, when the edges of the chop patterns and the short side are divided into fragments and the fragments are moved by calculating the EPEs and the DISs, it may be determined whether to form the chop patterns in accordance with whether the movements of the fragments of one chop pattern affect the EPEs of fragments of the other chop pattern or the EPEs of the fragments of the short side.

According to an embodiment, whether to form the chop patterns may be determined in accordance with whether the changes in the chop patterns affect each other or affect the short side as described above. The present invention is not limited thereto. For example, whether to form the chop patterns may be determined in accordance with a length of the short side. In this case, a reference length is set and it may be determined whether to form the chop pattern by determining whether the length of the short side is not greater than the reference length.

When the chop patterns are not formed, the hexagonal patterns HP are formed to correspond to the short sides in operation S114. The mask layout Ptl2 including the hexagonal notch design Pth may be designed by forming the hexagonal patterns HP to correspond to the short sides. Then, a process may proceed to operation S120 of dividing the edges of the hexagonal notch design Pth into the fragments.

When the chop patterns are formed, the patterns in the diagonal directions are respectively formed in the two vertices of the short side in operation S114a. The mask layout Ptl1 including the diagonal notch design Ptd may be designed by respectively forming the patterns in the diagonal directions in the two vertices of the short side. Then, operation S120a of dividing the edges of the diagonal notch design Ptd into the fragments is performed. Then, operation S130 of estimating the contour of the target pattern may be performed.

On the other hand, according to an embodiment, the hexagonal notch design may be formed by omitting operation S112 of determining whether to form the patterns in the diagonal directions and directly forming the hexagonal patterns HP on the short sides of the rectangular pattern No'. Such an embodiment is applied when a size and a shape of the target pattern Pt including the rectangular notch are approximately known.

Figure 5A:
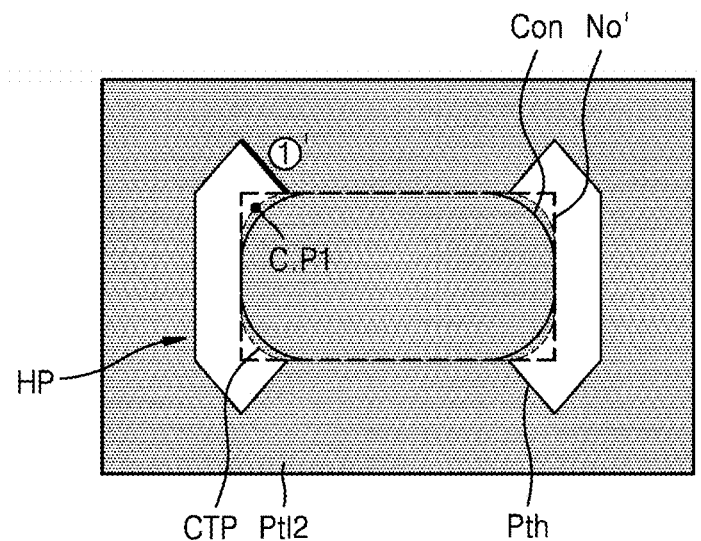
FIGS. 5A to 5C are conceptual views illustrating processes of dividing edges of hexagonal patterns into fragments and calculating edge placement errors (EPE) in an OPC method according to an embodiment of the inventive concept.
Figure 5B:
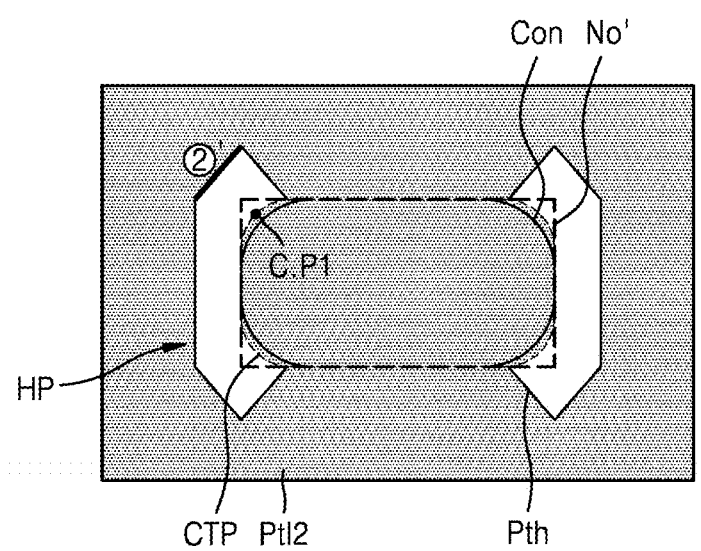
Figure 5C:
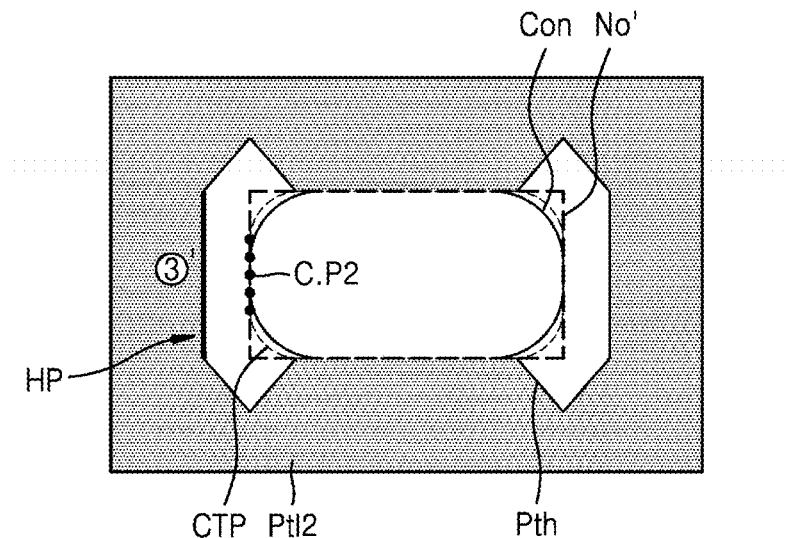

FIGS. 5A to 5C are conceptual views illustrating processes of dividing edges of hexagonal patterns into fragments and calculating edge placement errors (EPE) in an OPC method according to an embodiment of the inventive concept. Descriptions previously provided with reference to FIGS. 1 to 4 are briefly given or omitted.

Referring to FIG. 5A, in the mask layout Ptl2 including the hexagonal notch design Pth, the edges of the hexagonal patterns HP may be divided into the fragments corresponding to the first to fifth sides ① to ⑤. On the other hand, the EPE of a first fragment ①' corresponding to the first side ① may be calculated with a point of the corner of an intended target pattern CTP as a first control point C.P1. That is, the EPE of the first fragment ①' may be calculated by a difference between the selected first control point C.P1 and a contour Con. In addition, after moving the first fragment ①' by calculating the DIS, when the EPE of the first fragment ①' is calculated again, the same first control point C.P1 may be used.

Referring to FIG. 5B, the EPE of a second fragment ②' corresponding to the second side ② may be calculated by using the first control point C.P1. That is, the first fragment ①' and the second fragment ②' may use the same point of the intended target pattern CPT as the first control point C.P1. Therefore, after calculating the EPE of the second fragment ②' by the difference between the first control point C.P1 and the contour Con and moving the second fragment ②' by calculating the DIS, when the EPE of the second fragment ②' is calculated again, the same first control point C.P1 may be used. As a result, by repeating operation S130 of estimating the contour Con of the target pattern of FIG. 1 to operation S170 of moving the fragment by the displacement DIS a plurality of number of times, the first fragment ①' and the second fragment ②' may be moved so that the EPE calculated by the same first control point C.P1 is not greater than the set reference value.

Referring to FIG. 5C, the EPEs of a third fragment ③' corresponding to the third side ③ may be calculated by using at least two points of a linear portion of the intended target pattern CTP as second control points C.P2. In addition, when one of the EPEs calculated by the at least two second control points C.P2 is not greater than the set reference value, the process of moving the third fragment ③' may be terminated. Therefore, the process of moving the third fragment ③' may be early terminated by selecting a greater number of second control points C.P2. Since the time spent on calculating the EPE increases as the number of second control points C.P2 increases, a proper number of second control points C.P2 may be selected considering the time spent on calculating the EPE.

On the other hand, although not shown, a fourth fragment corresponding to the fourth side ④ and a fifth fragment corresponding to the fifth side ⑤ may also use the same point of the corner of the intended target pattern CTP as a control point. Therefore, the EPEs and the DISs of the fourth fragment and the fifth fragment may be calculated by using the same control point.

As a result, in the OPC method according to an embodiment of the inventive concept, a simple OPC shape may be secured by controlling the corner rounding phenomenon through the first fragment ①' and the second fragment ②' and the fourth fragment and the fifth fragment and controlling all the EPEs to be satisfied through the third fragment ③'.

Figure 6:
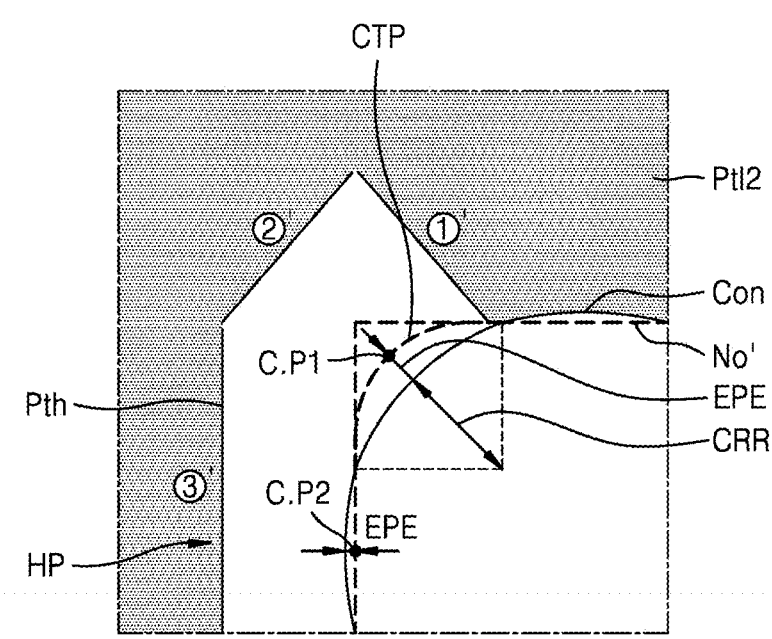
FIG. 6 is a view illustrating an enlargement of a part of layout including a hexagonal notch design for describing concepts of EPE calculation and displacement of a fragment.

FIG. 6 is a view illustrating an enlargement of a part of layout including a hexagonal notch design for describing concepts of EPE calculation and displacement of a fragment.

Referring to FIG. 6, as described above, the first fragment ①' and the second fragment ②' may have the same point of the corner of the intended target pattern CTP as the first control point C.P1. Therefore, the EPEs of the first fragment ①' and the second fragment ②' may be calculated by a distance or a difference between the first control point C.P1 and a neighboring portion of the contour Con.

When the EPEs are obtained, the DISs of the first fragment ①' and the second fragment ②' may be determined by the previous Equation (2). On the other hand, FBs respectively applied to the first fragment ①' and the second fragment ②' may be different from each other. Therefore, although the EPEs are the same, the DISs of the first fragment ①' and the second fragment ②' may be different from each other. When the DISs are determined, the first fragment ①' and the second fragment ②' may be moved by each of the DISs.

On the other hand, the third fragment ③' may have the at least two points of the linear portion of the intended target pattern CTP as the second control points C.P2 and the EPE of the third fragment ③' may be calculated by a distance or a difference between the second control point C.P2 and a neighboring portion of the contour Con. As described above, a plurality of EPEs of the third fragment ③' may be calculated as a plurality of second control points C.P2 are selected. The DIS of the third fragment ③' based on the plurality of EPEs may be calculated by a varying method. For example, the DIS may be calculated based on the smallest value among the plurality of EPEs or an average value of the plurality of EPEs. When the DIS is determined, the third fragment ③' may be moved by the DIS. On the other hand, when one of the plurality of EPEs is not greater than the set reference value, a process of moving the third fragment ③' may be terminated.

On the other hand, when the corner rounding phenomenon is described, a corner rounding radius (CRR) may be defined. For example, the CRR may be defined as a distance from a corner to a point at which the contour Con first meets the target pattern Pt.

Figure 8:
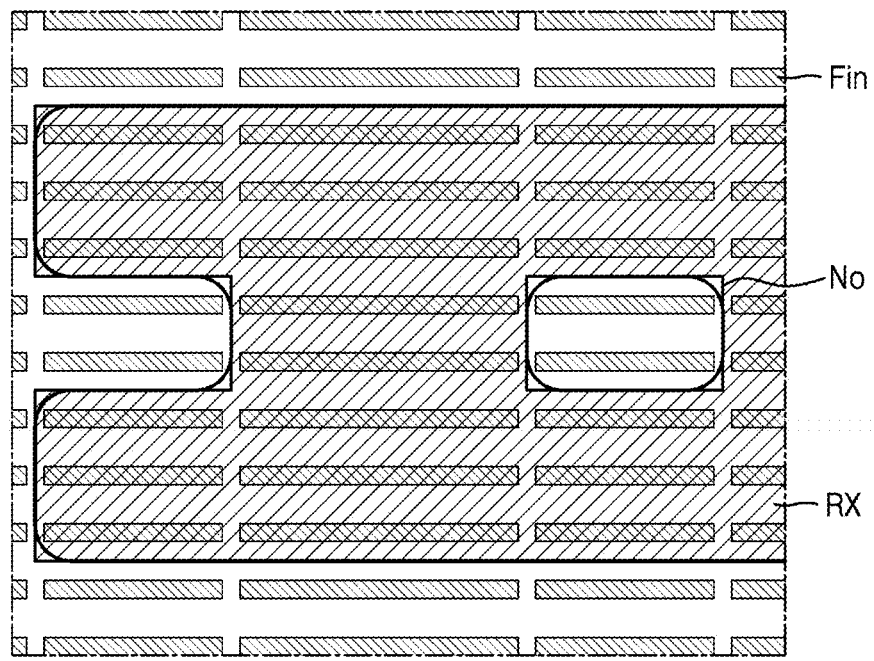
FIG. 8 is a plan view illustrating a rectangular notch in more detail in the multi-height cell structure of FIG. 7.

FIG. 7 is a plan view illustrating a multi-height cell structure. FIG. 8 is a plan view illustrating a rectangular notch in more detail in the multi-height cell structure of FIG. 7.

Referring to FIG. 7, in a cell structure in which a plurality of cell regions linearly extend, the cell regions may include a plurality of p-type cell regions P and a plurality of n-type cell regions N. In addition, as illustrated in FIG. 7, the cell regions having the same conductivity type may be repetitively arranged by two. On the other hand, recently, the multi-height cell structure in which the cell regions of the same conductivity type are combined with each other has been adopted. For example, in a double-height cell structure, two cells are combined with each other. In the multi-height cell structure, the rectangular notch No is formed. The corner rounding phenomenon occurs in the notch No as described above.

Figure 11:
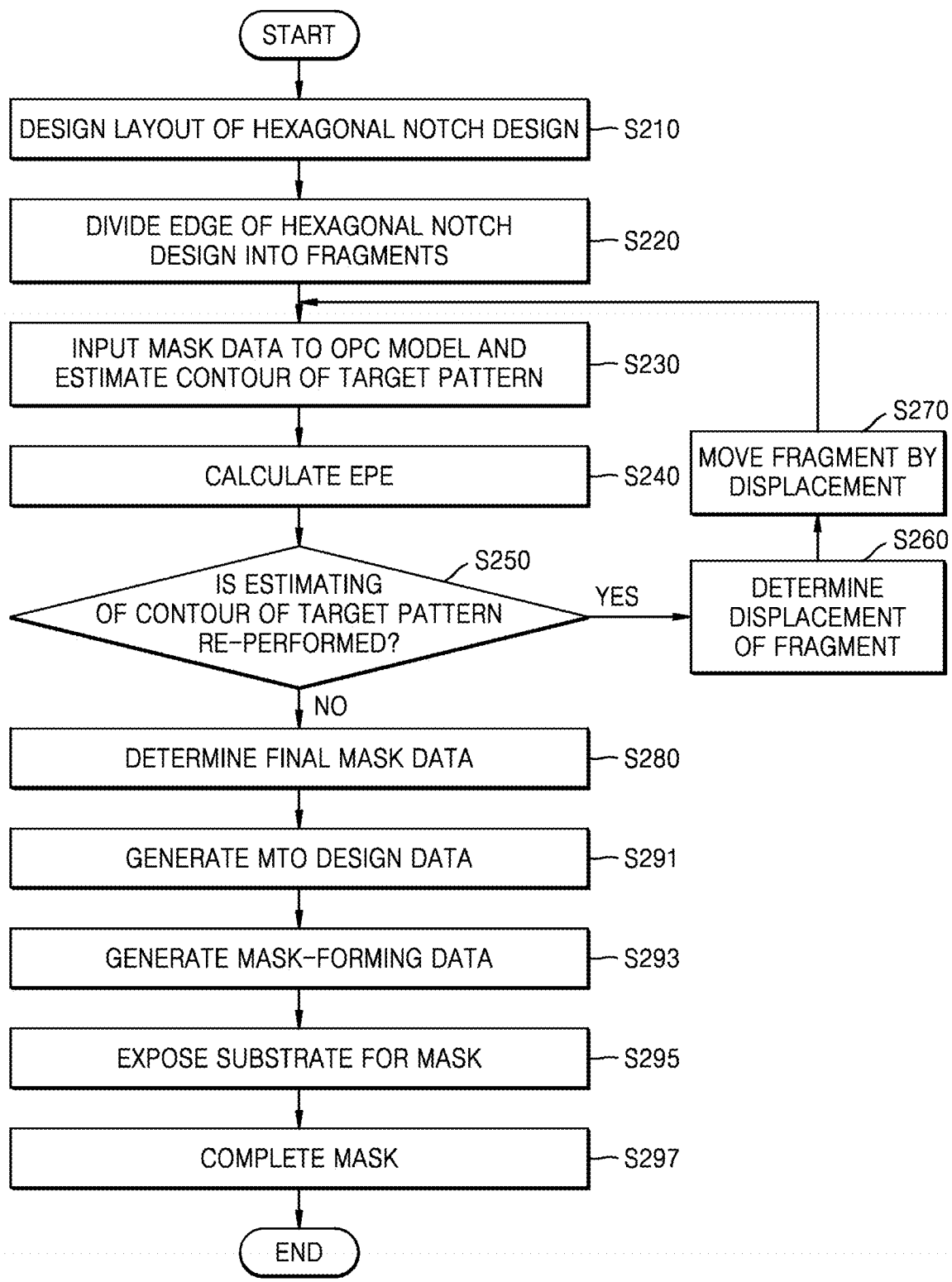
FIG. 11 is a flowchart illustrating processes of a method of manufacturing a mask, according to an embodiment of the inventive concept.
Figure 12:
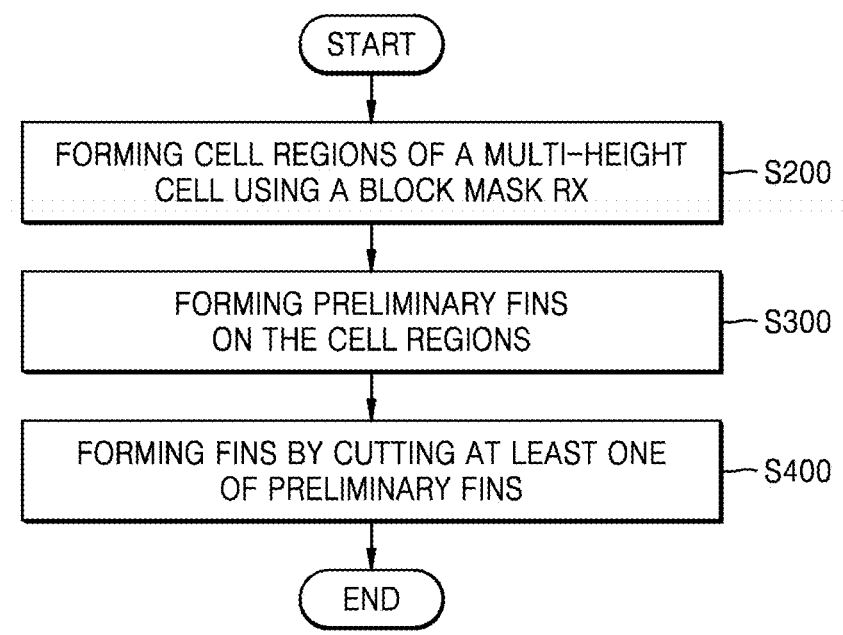
FIG. 12 is a flowchart of fabricating a multi-height cell using a mask pattern formed according to an exemplary embodiment of the inventive concept.

Referring to FIGS. 8 and 12, more detailed description of forming the multi-height cell structure using a mask formed according to an example manufacturing of a mask of FIG. 11 will be given as follows. The description of FIG. 11 will be made in detail later. A plurality of fins Fin that linearly extend are formed on a substrate. A process of forming a block mask RX that covers the cell regions through the exposure process to isolate the cell regions including the plurality of fins Fin from each other may be performed. For example, the block mask RS may be used to define an active region in which the cell regions are formed as shown in step S200 of FIG. 12 showing a flowchart of manufacturing the multi-height cell. In step S300, a plurality of preliminary fins may be formed on the cell regions. In step S400, some of the plurality of preliminary fins may be cut or parts of some of the plurality of preliminary fins may be removed using the block mask RX to form the plurality of fins Fin. Therefore, a layout of the block mask RX may correspond to a layout of the cell structure. In FIG. 8, a hatched portion corresponds to an ideal shape of the block mask RX for forming multi-height cells and a portion surrounded by a thick solid line may correspond to a shape of the block mask RX. In the block mask RX, due to the corner rounding phenomenon, corners are curved.

Each of the cell regions includes the plurality of fins Fin. The fins Fin in the same cell region are used for one fin field effect transistor (FET) device. As the number of fins Fin increases, a high speed fin FET device may be implemented. Therefore, the multi-height cell structure is introduced and accordingly, a greater number of fins Fin are included in the same cell region. In the multi-height cell structure, the notch No is included. Therefore, the block mask RX may also include the notch No.

On the other hand, due to the corner rounding phenomenon that occurs in the exposure process, a fin-tailing phenomenon occurs in the notch No of the multi-height cell structure and accordingly, the reliability of a product deteriorates, and process margin and yield deteriorate. In order to solve the fin-tailing phenomenon that occurs in the notch No, two masks may be used. However, mass-producibility may deteriorate.

However, in the OPC method according to the current embodiment, the layout including the hexagonal notch design to correspond to the notch No is designed and the edge of the hexagonal notch design is divided into the fragments and accordingly, the corner rounding phenomenon is minimized to solve the fin-tailing phenomenon and only one mask capable of implementing a multi-height cell may be manufactured. Therefore, the OPC method according to the current embodiment may contribute to implementation of a reliable product, increase in process margin, increase in yield, and increase in mass-producibility.

Figure 9A:
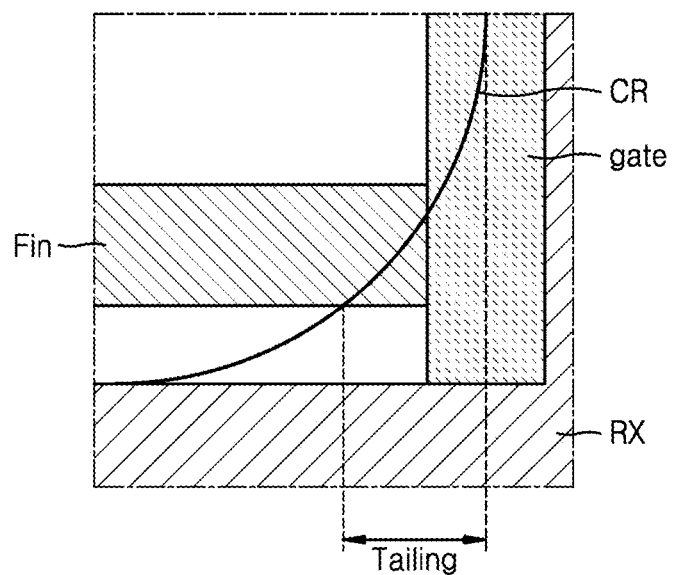
FIGS. 9A to 9C are conceptual views illustrating references for determining whether to use a mask in accordance with deterioration caused by a corner rounding phenomenon.
Figure 9B:
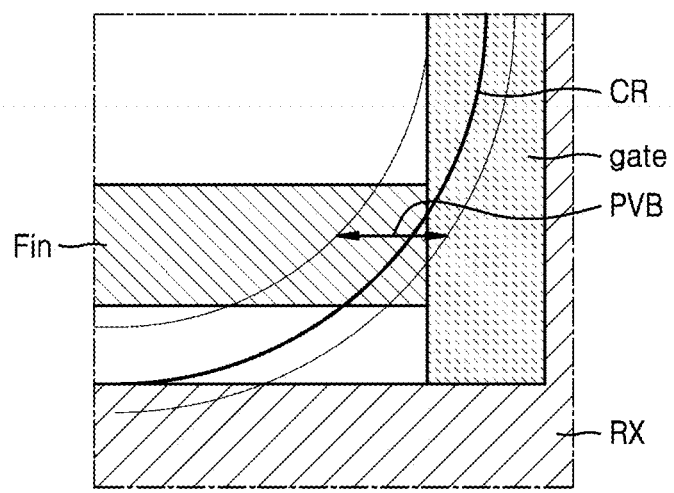
Figure 9C:
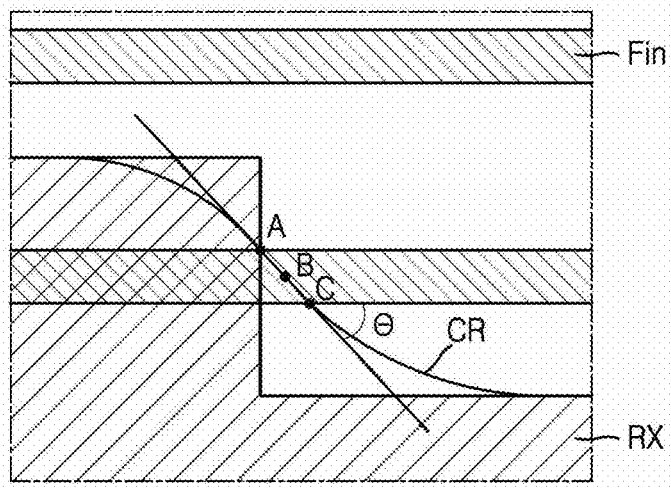

FIGS. 9A to 9C are conceptual views illustrating references for determining whether to use one mask in accordance with deterioration caused by a corner rounding phenomenon.

In FIG. 9A, a concept of the fin-tailing phenomenon is illustrated. The notch No of the multi-height cell is removed in the form of a rectangle to a portion marked with dashed lines in the exposure process. However, due to the corner rounding phenomenon, a part of the notch No may remain outside a corner rounding line CR. In particular, a fin Fin that remains outside the corner rounding line CR is referred to as fin-tailing, which is marked with a double-headed arrow.

The fin-tailing causes a short with a neighboring conductive region or undesirable growth of an epitaxial layer. Therefore, the fin-tailing need to remain to have a length not greater than a set reference. On the other hand, here, a gate may correspond to a gate line formed to cross fins Fin.

In FIG. 9B, a concept of the PVB is illustrated. The PVB may mean distribution of the corner rounding line CR. That is, the PVB may mean the distribution of the corner rounding line CR in accordance with a change in strength of the corner rounding phenomenon in the exposure process. The PVB is to be maintained within a set reference range.

In FIG. 9C, a concept of a slope of the fin Fin is illustrated. When a cell structure in which cell regions including different numbers of fins Fin are connected to each other is implemented, a part of the fin Fin may be removed by using the block mask RX including the rectangular corner. For example, the block mask RX for defining the cell regions may also be used to cut the fin Fin. However, due to the corner rounding phenomenon of the corner of the block mask RX, the fin Fin is not vertically removed and may be removed in the form of a curved line as illustrated through the corner rounding line CR. The slope of the fin Fin may be defined by an angle θ between a straight line obtained by connecting points A, B, and C that contact the corner rounding line CR in a top, an intermediate portion, and a bottom of the fin Fin and a horizontal line of the fin Fin. The slope of the fin Fin is to be no less than the set reference range.

The concepts of the fin-tailing, the PVB, and the slope of the fin Fin may be references for determining whether to implement the notch or a change in the number of fins Fin by one mask or two masks. For example, in the OPC method according to the current embodiment including the design of the layout including the hexagonal notch design, when the concepts are references, it is determined that the multi-height cell structure including the notch may be sufficiently implemented by using the one mask.

Figure 10:
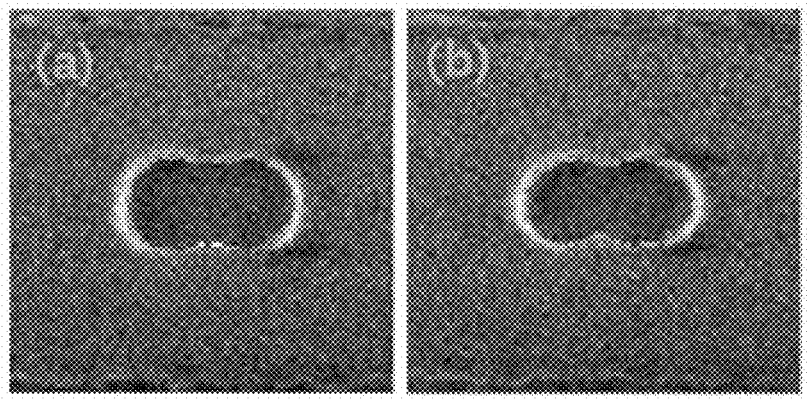
FIG. 10 illustrates after develop inspection (ADI) photographs for a multi-height cell including a notch formed based on a mask layout by a conventional OPC method and the OPC method of FIG. 1.

FIG. 10 illustrates after develop inspection (ADI) photographs for a multi-height cell including a notch formed based on a mask layout by a conventional OPC method and the OPC method of FIG. 1.

FIG. 10A is an ADI photograph for the multi-height cell including the notch formed based on the mask layout by the OPC method according to the current embodiment. FIG. 10B is an ADI photograph for a multi-height cell including a notch formed based on a mask layout by a conventional OPC method. As illustrated in the drawings, it may be noted that the corner rounding phenomenon of FIG. 10A is less than the corner rounding phenomenon of FIG. 10B. For reference, in the photographs of FIGS. 10A and 10B, the outsides of the notches may be block masks.

FIG. 11 is a flowchart illustrating processes of a method of manufacturing a mask, according to an embodiment of the inventive concept. Descriptions previously provided with reference to FIGS. 1 to 10 are briefly given or omitted.

Referring to FIG. 11, in the mask manufacturing method according to the current embodiment, first, the OPC method is performed. Here, the OPC method may include operation S210 of designing the layout of the hexagonal notch design to operation S280 of determining the final mask data. In the mask manufacturing method according to the current embodiment, description of operations S210 to S280 of the OPC method is the same as the description of operations S110 to S180 of the OPC method of FIG. 1.

After performing the OPC method, mask tape-out (MTO) design data is transmitted in operation S291. In general, the MTO may mean transmitting the final mask data on which the OPC process is completely performed to a mask manufacturing team and requesting the mask manufacturing team to manufacture a mask. Therefore, the MTO design data may correspond to the final mask data on which the OPC method is performed. The MTO design data may have a graphic data format used for electronic design automation (EDA) software. For example, the MTO design data may have a data format such as a graphic data system II (GDS2) or an open artwork system interchange standard (OASIS).

After transmitting the MTO design data, mask-forming data is prepared in operation S293. A process of preparing the mask-forming data is commonly referred to as mask data preparation (MDP). The MDP may include, for example, format conversion referred to as fracturing, augmentation of a barcode for mechanical reading, a standard mask pattern for testing, a job deck, etc., and automatic and hand-operated verifications. Here, the job deck may mean creating a text file on a series of instructions such as arrangement information of multi-mask files, a reference dose, and an exposing speed or method.

On the other hand, the format conversion, that is, the fracturing, may mean a process of dividing the MTO design data by regions and changing the MTO design data into an electron beam exposure format. The fracturing may include, for example, data manipulation such as size scaling, data sizing, data rotation, pattern reflection, or color reversal. In the process of conversion through fracturing, data on a lot of systematic errors that may be generated somewhere in a process of transmission from design data to an image on a wafer may be corrected. The process of correcting the data on the systematic errors is referred to as mask process correction (MPC). The MPC may include, for example, works of performing line width control referred to as CD control and increasing a degree of precision of pattern arrangement. Therefore, the fracturing may contribute to improvement of quality of the final mask and may be previously performed for mask process correction.

On the other hand, the MDP may include the MPC. As described above, the MPC may mean a process of correcting errors generated in the exposure process, that is, the systematic errors. Here, the exposure process may be a concept including electron beam writing, developing, etching, and baking. Furthermore, data processing may be performed before the exposure process. The data processing is a process of pre-processing the mask data and may include grammar check for the mask data and exposing time estimation.

After operation S293 of preparing the mask-forming data, a substrate for a mask is exposed based on the mask-forming data in operation S295. Here, exposure may mean, for example, the electron beam writing. Here, the electron beam writing may be performed by, for example, a gray writing method using a multi-beam mask writer (MBMW). In addition, the electron beam writing may be performed by using a variable shape beam (VSB) writer. In an example embodiment, the substrate may include a mask blank such as a transparent fused silica blank.

On the other hand, after operation S293 of preparing the mask-forming data, a process of converting the mask data into pixel data may be performed before the exposure process. The pixel data directly used for exposure may include data on a shape to be exposed and data on respectively allotted doses. Here, the data on the shape may be bit-map data obtained by converting the shape data that is vector data through rasterization.

After the exposure process, a series of processes are performed to complete a mask in operation S297. The series of processes may include, for example, developing, etching, and cleansing processes. In addition, the series of processes for manufacturing the mask may include a measuring process and a defect examining or repairing process. In addition, a pellicle coating process may be included. In the pellicle coating process, when it is determined that there are no contamination particles or chemical spots through final cleansing and examination, a pellicle is attached to a surface of the mask in order to protect the mask against sequential contaminations during delivery of the mask and in the lifespan of the mask.

In the mask manufacturing method according to the current embodiment, it is possible to implement the mask layout capable of minimizing the corner rounding phenomenon without violating the MRC based on the OPC method including the design of the layout including the hexagonal notch design and to manufacture a high quality mask capable of ideally forming the target pattern on the wafer based on the mask layout. For example, in the mask manufacturing method according to the current embodiment, one mask that may sufficiently implement the target pattern having the multi-height cell structure including the notch may be manufactured.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
generating a pre-OPC mask layout including a notch design of which a boundary corresponds to an outer boundary of a combined mask pattern of a preliminary rectangular mask pattern and a hexagonal mask pattern that is placed on at least one side of the preliminary rectangular mask pattern;
dividing an edge of the hexagonal mask pattern of the combined mask pattern into a plurality of fragments, wherein the edge of the hexagonal mask pattern of the combined mask pattern is placed outside the preliminary rectangular mask pattern;
inputting mask data of the pre-OPC mask layout with the plurality of fragments to an optical proximity correction (OPC) model;
estimating a contour of a first target pattern transcribed from the combined mask pattern through simulation;
calculating an edge placement error (EPE) that is a difference between the contour and an edge of an intended target pattern;
determining a displacement of each of the plurality of fragments based on the EPE;
generating a corrected mask layout by moving each of the plurality of fragments by the displacement; and
forming a target mask and the semiconductor device based on the corrected mask layout.

2. The method of claim 1,
wherein the pre-OPC mask layout includes a mask pattern corresponding to a multi-height cell including a plurality of standard cells arranged and connected to each other in a first direction and a notch between two adjacent standard cells of the plurality of standard cells, and
wherein the mask pattern includes the combined mask pattern that corresponds to the notch of the multi-height cell.

3. The method of claim 2,
wherein the intended target pattern is implemented by one mask formed using the corrected mask layout.

4. The method of claim 1, further comprising:
repeating of the estimating of the contour, the calculating of the EPE, the determining of the displacement and the generating of the corrected mask layout is performed on a previously generated corrected mask layout until the EPE is less than or equal to a set reference value.

5. The method of claim 4,
wherein when a number of times that the repeating is performed reaches a set reference number, the repeating is terminated.

6. The method of claim 1,
wherein the hexagonal mask pattern is placed on each of two short sides of the at least one side of the preliminary rectangular mask pattern.

7. The method of claim 6,
wherein the hexagonal mask pattern of the combined mask pattern comprises a first side and a second side that surround a first vertex at which a first short side of the two short sides of the preliminary rectangular mask pattern meets a first long side thereof, a fourth side and a fifth side that surround a second vertex at which the first short side meets a second long side, and a third side that connects the second side to the fourth side, and
wherein the first to fifth sides are positioned outside the preliminary rectangular mask pattern to form the outer boundary of the combined mask pattern and a sixth side that faces the third side does not exist in the combined mask pattern.

8. The method of claim 7,
wherein the plurality of fragments include a first fragment and a second fragment corresponding to the first side and the second side, respectively,
wherein the first fragment and the second fragment share a first control point on the intended target pattern,
wherein the plurality of fragments further include a fourth fragment and a fifth fragment corresponding to the fourth side and the fifth side, respectively, that share a second control point on the intended target pattern, and
wherein the calculating of the EPE is performed on the first control point and the second control point.

9. The method of claim 1,
wherein by repeating of the estimating of the contour, the calculating of the EPE, the determining of the displacement and the generating of the corrected mask layout using a previously generated corrected mask layout, a corner rounding radius (RCC) of a target pattern transcribed from the corrected mask layout is minimized.

10. The method of claim 1,
wherein the determining of the displacement is performed by multiplying a set feedback factor to the EPE.

* * * * *